US011134600B2

(12) United States Patent
Deng et al.

(10) Patent No.: US 11,134,600 B2
(45) Date of Patent: Sep. 28, 2021

(54) ASSEMBLY SYSTEM

(71) Applicants: Tyco Electronics (Shanghai) Co. Ltd., Shanghai (CN); Tyco Electronics Polska Sp. z.o.o., Warsaw (PL); TE Connectivity Corporation, Berwyn, PA (US); Kunshan League Automechanism Co., Ltd., Kunshan (CN)

(72) Inventors: Yingcong Deng, Shanghai (CN); Jaroslaw Kowalski, Bydgoszcz (PL); Andrzej Przybylski, Bydgoszcz (PL); Jaroslaw Grzebski, Bydgoszcz (PL); Dandan Zhang, Shanghai (CN); Lvhai Hu, Shanghai (CN); Fengchun Xie, Shanghai (CN); Yun Liu, Shanghai (CN); Roberto Francisco-Yi Lu, Bellevue, WA (US); Haidong Wu, Kunshan (CN); Hui Xiao, Kunshan (CN)

(73) Assignees: Tyco Electronics (Shanghai) Co. Ltd., Shanghai (CN); Tyco Electronics Polska Sp. z.o.o., Warsaw (PL); TE Connectivity Corporation, Berwyn, PA (US); Kunshan League Automechanism Co., Ltd., Kunshan (CN)

( * ) Notice: Subject to any disclaimer, the term of this patent is extended or adjusted under 35 U.S.C. 154(b) by 281 days.

(21) Appl. No.: 16/170,195

(22) Filed: Oct. 25, 2018

(65) Prior Publication Data
US 2019/0124807 A1 Apr. 25, 2019

(30) Foreign Application Priority Data
Oct. 25, 2017 (CN) .......................... 201711008175.7

(51) Int. Cl.
*B23P 19/00* (2006.01)
*H05K 13/08* (2006.01)
(Continued)

(52) U.S. Cl.
CPC ..... *H05K 13/0812* (2018.08); *H05K 13/0061* (2013.01); *H05K 13/04* (2013.01);
(Continued)

(58) Field of Classification Search
CPC .......... H05K 13/0812; H05K 13/0815; H05K 13/0813; H05K 13/0061; H05K 13/04;
(Continued)

(56) References Cited

U.S. PATENT DOCUMENTS 10,362,719 B2 * 7/2019 Iisaka ................ H05K 13/0408

* cited by examiner

*Primary Examiner* — Thiem D Phan
(74) *Attorney, Agent, or Firm* — Barley Snyder

(57) ABSTRACT

An assembly system that includes a robot adapted to grip an electronic device to be mounted on a circuit board, a first vision system that identifies a position and a posture of the electronic device gripped by the robot, a fixing device that fixe a plurality of circuit boards thereon, and a second vision system that identifies a position and a posture of the circuit board fixed on the fixing device. The robot mounts the gripped electronic device on a circuit board under the visual guidance of the first vision system and the second vision system. The view field of the second vision system is not capable of completely covering a surface region of all circuit boards fixed on the fixing device. The assembly system further includes a moving mechanism that moves the second vision system in a first horizontal direction and a second horizontal direction perpendicular to the first horizontal direction, so that the second vision system completes identification of all circuit boards on the fixing device step by step. With this assembly system, the robot complete the assembly work of all circuit boards at an assembly station.

(Continued)

Also, a method of assembling a circuit board that mounts a gripped electronic device on a circuit board.

12 Claims, 1 Drawing Sheet

(51) Int. Cl.
*H05K 13/04* (2006.01)
*H05K 13/00* (2006.01)

(52) U.S. Cl.
CPC ..... *H05K 13/0413* (2013.01); *H05K 13/0813* (2018.08); *H05K 13/0815* (2018.08); *Y10T 29/53174* (2015.01)

(58) Field of Classification Search
CPC ........... Y10T 29/49004; Y10T 29/4913; Y10T 29/53052; Y10T 29/53087; Y10T 29/53174; Y10T 29/49131
USPC ...... 29/739, 564.1, 709, 720, 729, 787, 832, 29/874
See application file for complete search history.

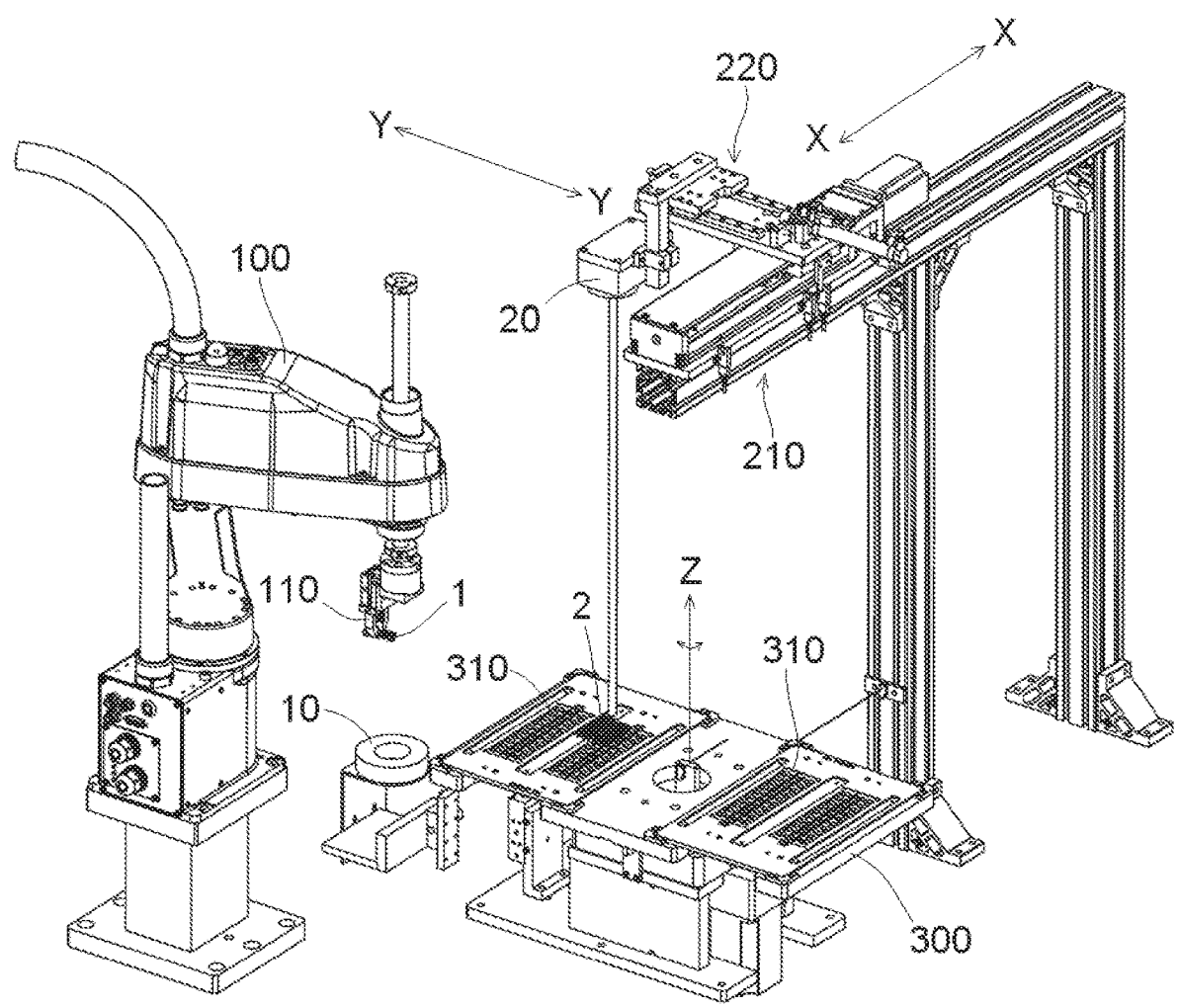

ASSEMBLY SYSTEM

CROSS-REFERENCE TO RELATED APPLICATION

This application claims the benefit of the filing date under 35 U.S.C. § 119(a)-(d) of Chinese Patent Application No. 201711008175.7 filed on Oct. 25, 2017.

FIELD OF THE INVENTION

The present invention relates, in general, to an assembly system and an assembling method and, in particular, to an assembly system and an assembling method for mounting electronic devices on a circuit board.

BACKGROUND

In the field of electronics equipment manufacturing, there is often the need to mount various electronic devices, such as electronic components, electronic chips, or semi-finished electronic products on a circuit board. In the related art, in order to improve the assembly efficiency, a vision-guided robot is usually used to complete the assembly work of the circuit board. Therefore, there is the need to provide a visual system to identify a position and a posture of the circuit board. However, because a view field of a visual system, for example, a camera, is limited, the visual system often cannot completely cover all surface areas of a plurality of circuit boards at the assembly station. Therefore, in the prior art, only one circuit board can be assembled at an assembly station at a time. This reduces the assembly efficiency of the circuit board.

SUMMARY

An assembly system, constructed in accordance with the present invention, includes a robot adapted to grip an electronic device to be mounted on a circuit board and mount a gripped electronic device on a circuit board. This assembly system also a plurality of fixing devices adapted to fix a plurality of circuit boards. An assembly system, constructed in accordance with the present invention, further includes a first vision system for identifying a position and a posture of an electronic device gripped by the robot and for visually guiding a robot gripped electronic device to a circuit board. An assembly system, constructed in accordance with the present invention, also includes a second vision system fixed on the fixing device and has a view field not capable of completely covering a surface region of all circuit boards. The second vision system identifies a position and a posture of a circuit board fixed on the fixing device and visually guides the robot to mount a gripped electronic device on a circuit board. An assembly system, constructed in accordance with the present invention, also includes a moving mechanism for moving the second vision system in a first horizontal direction and a second horizontal direction perpendicular to the first horizontal direction.

According to another aspect of the present invention, a method of assembling a circuit board includes the steps of:
(1) providing the assembly system set out immediately above;
(2) moving unassembled circuit boards fixed on one fixing device to the assembly station by rotating the rotatable table forward by one step;
(3) synchronously performing following steps (1) and (2):
(4) gripping the electronic device by the robot and identifying the position and the posture of the electronic device by the first vision system;
(5) moving the second vision system by the moving mechanism and identifying the position and the posture of the unassembled circuit boards fixed on one fixing device step-by-step by the second vision system; and
(6) mounting the gripped electronic device on the circuit board by the robot under the visual guidance of the first vision system and the second vision system.

BRIEF DESCRIPTION OF THE DRAWINGS

The above and other features of the present invention will become more apparent by describing in detail exemplary embodiments thereof with reference to the accompanying drawing, in which FIG. 1 is an illustrated perspective view of an assembly system according to an embodiment of the present invention.

DETAILED DESCRIPTION OF THE EMBODIMENTS

The present invention may be embodied in a number of different forms and the following description of the present invention should not be construed as being limited to the embodiment set forth herein which is provided so that the disclosure of the present invention will be thorough and complete and will fully convey the concept of the present invention to those skilled in the art.

In the following detailed description, for purposes of explanation, numerous specific details are set forth in order to provide a thorough understanding of the present invention. It will be apparent, however, that the present invention may be practiced without these specific details. In other instances, well-known structures and devices are schematically shown in order to simplify the drawing.

As shown in FIG. 1, an assembly system, constructed in accordance with the present invention, comprises a robot 100, a first vision system 10, a plurality of fixing devices 310, and a second vision system 20. The robot 100 is adapted to grip an electronic device 1 to be mounted on a circuit board 2 by a manipulator 110 which is mounted on an actuator of the robot 100.

The first vision system 10 identifies a position and a posture of the electronic device 1 gripped by the robot 100. The fixing devices 310 are adapted to fix a plurality of circuit boards 2 thereon.

The second vision system 20 identifies a position and a posture of the circuit boards 2 fixed on the fixing devices 310. The robot 100 is adapted to mount the gripped electronic device 1 on the circuit board 2 under the visual guidance of the first vision system 10 and the second vision system 20.

As shown in FIG. 1, a view field of the second vision system 20 is not capable of completely covering a surface region of all circuit boards 2 fixed on the fixing devices 310. In order to identify all circuit boards 2 fixed on the fixing devices 310, in an embodiment of the present invention, as shown in FIG. 1, the assembly system further includes a moving mechanism 210, 220 that moves the second vision system 20 in a first horizontal direction X and a second horizontal direction Y perpendicular to the first horizontal direction X. In this way, the second vision system 20 is capable of completing the identification of all circuit boards 2 on the fixing device 310 step-by-step.

As shown in FIG. 1, in an embodiment of the present invention, the assembly system further includes a rotatable table 300. The rotatable table 300 may be rotated about a vertical axis Z perpendicular to the first horizontal direction X and the second horizontal direction Y. The plurality of fixing devices 310 are mounted on the rotatable table 300. The plurality of fixing devices 310 are arranged around the periphery of rotatable table 100 and spaced from each other.

The rotatable table 300 is adapted to rotate the plurality of fixing devices 310 in turn to an assembling station where the robot 100 performs an assembly work of mounting electronic devices 1 on the circuit boards 2 fixed on one fixing device 310.

As shown in FIG. 1, in an embodiment of the present invention, after the assembly work of all circuit boards 2 on one fixing device 310 is completed, the rotatable table 310 is rotated forward by one step to move the assembled circuit boards 2 to an unloading station and move the unassembled circuit boards 2 fixed on another fixing device 310 to the assembling station.

As shown in FIG. 1, in an embodiment of the present invention, the plurality of circuit boards 2 fixed on each of the fixing devices 310 are arranged in an array.

As shown in FIG. 1, in an embodiment of the present invention, the moving mechanism 210, 220 mainly comprises a first horizontal moving mechanism 210 and a second horizontal moving mechanism 220. The first horizontal moving mechanism 210 is moves the second vision system 20 in the first horizontal direction X. The second horizontal moving mechanism 220 moves the second vision system 20 in the second horizontal direction Y. The second horizontal moving mechanism 220 is mounted on the first horizontal moving mechanism 210 and the second vision system 20 is mounted on the second horizontal moving mechanism 220. Thereby, the second vision system 20 may be moved in the first horizontal direction X and the second horizontal direction Y.

As shown in FIG. 1, in an embodiment of the present invention, the electronic device 1 may comprise, but not limited to, an electronic component, such as a resistance, an inductance, a capacitance, a terminal of a connector or the like, an electronic product, such as a connector, or the like, or an electronic subassembly, such as, a chip, an electronic module or the like.

As shown in FIG. 1, in an embodiment of the present invention, the first vision system 10 detects whether the electronic device 1 gripped by the robot 100 is qualified. For example, the first vision system 10 is detects whether a size and an appearance of the electronic device 1 gripped by the robot 100 meets a predetermined requirement.

As shown in FIG. 1, in an embodiment of the present invention, the second vision system 20 is also detects whether the circuit board 2 fixed on the fixing device 310 is qualified. For example, the second vision system 20 is adapted to detect whether a size and an appearance of the circuit board 2 fixed on the fixing device 310 meets a predetermined requirement.

In an exemplary embodiment of the present invention, the robot 100 may be a multi-degree-of-freedom robot, for example, the robot 100 may be a six-axis robot with six degrees of freedom.

In another exemplary embodiment of the present invention, there is a method of assembling the electronic devices 1 on the circuit boards 2. The method mainly comprises steps of:

S100: providing the above assembly system;

S200: moving the unassembled circuit boards 2 fixed on one fixing device 310 to the assemble station by rotating the rotatable table 310 forward by one step;

S300: synchronously performing following steps S310 and S320:

S310: gripping the electronic device 1 by the robot 100 and identifying the position and the posture of the electronic device 1 by the first vision system 10;

S320: moving the second vision system 20 by the moving mechanism 210, 220, and identifying the position and the posture of the unassembled circuit boards 2 fixed on one fixing device 310 step by step by the second vision system 20;

S400: mounting the gripped electronic device 1 on the circuit board 2 by the robot 100 under the visual guidance of the first vision system 10 and the second vision system 20.

In another embodiment of the present invention, the method may further comprise a step S500 of rotating the rotatable table 310 forward by one step, so as to move the assembled circuit boards 2 fixed on the one fixing device 310 to the assembling station and move the unassembled circuit boards 2 fixed on another fixing device 310 to the unloading station.

In another embodiment of the present invention, the step S310 may further include a step of detecting whether the electronic device 1 gripped by the robot 100 is qualified by the first vision system 10 and the step S320 may further include a step of detecting whether the unassembled circuit boards 2 fixed on the one fixing device 310 is qualified by the second vision system 20.

In an embodiment of the present invention, the first vision system 10 and the second vision system 20 each may comprise a camera.

It should be appreciated by those skilled in this art that the assembly system and the assembly method described above are intended to be illustrative of the present invention and are not to be taken as restrictive of the present invention. Many modifications may be made to the by those skilled in this art, and various features described may be freely combined with each other without conflicting in configuration or principle of the present invention.

It will be appreciated by those skilled in the art that various changes or modifications may be made without departing from the principles and spirit of the present invention, the scope of which is defined in the claims and their equivalents.

As used herein, an element recited in the singular and proceeded with the word "a" or "an" should be understood as not excluding plural of said elements or steps, unless such exclusion is explicitly stated. Furthermore, references to "one embodiment" of the present disclosure are not intended to be interpreted as excluding the existence of additional embodiments that also incorporate the recited features. Moreover, unless explicitly stated to the contrary, "comprising" or "having" an element or a plurality of elements having a particular property may include additional such elements not having that property.

What is claimed is:

1. An assembly system comprising:
   a robot adapted to:
   (a) grip an electronic device to be mounted on a circuit board, and
   (b) mount a gripped electronic device on a circuit board;
   a plurality of fixing devices adapted to fix a plurality of circuit boards;
   a first vision system for:

(a) identifying a position and a posture of an electronic device gripped by the robot, and
(b) visually guiding a robot gripped electronic device to a circuit board;

a second vision system:
(a) fixed on the fixing device,
(b) having a view field not capable of completely covering a surface region of all circuit boards,
(c) for identifying a position and a posture of a circuit board fixed on the fixing device, and
(d) for visually guiding the robot to mount a gripped electronic device on a circuit board;

a rotatable table on which the fixing devices are mounted for rotating the plurality of fixing devices to an assembly station where the robot mounts electronic devices on the plurality of circuit boards; and a moving mechanism for moving the second vision system in a first horizontal direction and a second horizontal direction perpendicular to the first horizontal direction.

2. The assembly system according to claim 1, wherein the fixing devices are mounted around the periphery of the rotatable table and separated from each other.

3. The assembly system according to claim 2, wherein, after the assembly work of all circuit boards on one fixing device is completed, the rotatable table is rotated forward by one step to move the assembled circuit boards to an unloading station and move the unassembled circuit boards fixed on another fixing device to the assembling station.

4. The assembly system according to claim 1, wherein the plurality of circuit boards fixed on each fixing devices are arranged in an array.

5. The assembly system according to claim 1, wherein the moving mechanism includes:

(a) a first horizontal moving mechanism that moves the second vision system in the first horizontal direction, and
(b) a second horizontal moving mechanism that:
(1) moves the second vision system in the second horizontal direction,
(2) is mounted on the first horizontal moving mechanism, and
(c) the second vision system is mounted on the second horizontal moving mechanism.

6. The assembly system according to claim 1, wherein the electronic device includes an electronic component, an electronic product, or an electronic subassembly.

7. The assembly system according to claim 1, wherein the first vision system detects whether an electronic device gripped by the robot is qualified.

8. The assembly system according to claim 7, wherein the first vision system detects whether a size and an appearance of the electronic device gripped by the robot meets a predetermined requirement.

9. The assembly system according to claim 1, wherein the second vision system also detects whether a circuit board fixed on a fixing device is qualified.

10. The assembly system according to claim 9, wherein the second vision system detects whether a size and an appearance of a circuit board fixed on a fixing device meets a predetermined requirement.

11. The assembly system according to claim 1, wherein the moving mechanism operates independently from the robot.

12. The assembly system according to claim 1, wherein the second vision system is mounted on the fixing device independently from the robot.

* * * * *